(12) United States Patent
Bourjot et al.

(10) Patent No.: US 10,797,138 B2
(45) Date of Patent: Oct. 6, 2020

(54) VERTICAL-TRANSPORT FIELD-EFFECT TRANSISTORS WITH SELF-ALIGNED CONTACTS

(71) Applicant: GLOBALFOUNDRIES Inc., Grand Cayman (KY)

(72) Inventors: Emilie Bourjot, Cohoes, NY (US); Daniel Chanemougame, Niskayuna, NY (US); Steven Bentley, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/947,991

(22) Filed: Apr. 9, 2018

(65) Prior Publication Data

US 2019/0312116 A1   Oct. 10, 2019

(51) Int. Cl.
| | |
|---|---|
| *H01L 29/00* | (2006.01) |
| *H01L 29/417* | (2006.01) |
| *H01L 29/66* | (2006.01) |
| *H01L 29/78* | (2006.01) |

(52) U.S. Cl.
CPC .. *H01L 29/41791* (2013.01); *H01L 29/66666* (2013.01); *H01L 29/66795* (2013.01); *H01L 29/7827* (2013.01); *H01L 29/7856* (2013.01)

(58) Field of Classification Search
CPC ......... H01L 29/41791; H01L 29/66666; H01L 29/66795; H01L 29/7827; H01L 29/7856
See application file for complete search history.

(56) References Cited

U.S. PATENT DOCUMENTS

| | | | |
|---|---|---|---|
| 6,370,680 B1 * | 4/2002 | Nguyen | H01L 22/34 716/50 |
| 9,741,609 B1 * | 8/2017 | Cheng | H01L 21/76847 |
| 9,818,875 B1 | 11/2017 | Bi et al. | |
| 9,991,267 B1 * | 6/2018 | Anderson | H01L 27/10867 |
| 10,062,752 B1 * | 8/2018 | Leobandung | H01L 29/775 |
| 10,211,288 B1 * | 2/2019 | Bi | H01L 29/0847 |

(Continued)

OTHER PUBLICATIONS

Taiwan Intellectual Property Office, Examination Report dated Mar. 3, 2020 in Taiwanese Patent Application No. 108107853.

(Continued)

*Primary Examiner* — Mounir S Amer
*Assistant Examiner* — Alexander Belousov
(74) *Attorney, Agent, or Firm* — Thompson Hine LLP; Anthony Canale

(57) ABSTRACT

Methods of forming contacts for vertical-transport field-effect transistors and structures for a vertical-transport field-effect transistor and contact. An interlayer dielectric layer is deposited over a gate stack, and a first opening is formed in the interlayer dielectric layer and penetrates through the gate stack to cut the gate stack into a first section and a second section. A dielectric pillar is formed in the first opening and is arranged between the first section of the gate stack and the second section of the gate stack. Second and third openings are formed in the interlayer dielectric layer that penetrate to the gate stack and that are divided by the dielectric pillar. A first contact in the second opening is coupled with the first section of the gate stack, and a second contact in the third opening is coupled with the second section of the gate stack.

10 Claims, 6 Drawing Sheets

(56) References Cited

U.S. PATENT DOCUMENTS

2009/0200604 A1     8/2009  Chidambarrao et al.
2018/0226491 A1*    8/2018  Bi .......................... H01L 29/785
2018/0261685 A1*    9/2018  Mochizuki ............ H01L 29/785

OTHER PUBLICATIONS

J. Ruzyllo, "ILD, Inter-Layer Dielectric", Semiconductor Glossary, retrieved from the Internet at www.semi1source.com/glossary/default.asp?searchterm=ILD%2C+Inter-Layer+Dielectric on Jan. 15, 2020.

\* cited by examiner

VERTICAL-TRANSPORT FIELD-EFFECT TRANSISTORS WITH SELF-ALIGNED CONTACTS

BACKGROUND

The present invention relates to semiconductor device fabrication and integrated circuits and, more specifically, to methods of forming contacts for vertical-transport field-effect transistors and structures for a vertical-transport field-effect transistor and contact.

Device structures for a field-effect transistor generally include a source, a drain, and a gate electrode configured to switch carrier flow in a channel region between the source and drain. When a control voltage exceeding a designated threshold voltage is applied to the gate electrode, carrier flow occurs in the channel region between the source and drain to produce a device output current. The channel region of a planar field-effect transistor is located beneath the top surface of a substrate on which the gate electrode is supported.

Planar field-effect transistors and fin-type field-effect transistors constitute a general category of transistor structures in which the direction of gated current in the channel is in a horizontal direction that is parallel to the substrate surface. In a vertical-transport field-effect transistor, however, the source and the drain are arranged at the top and bottom of a semiconductor fin. For that reason, the direction of the gated current transport in the channel between the source and drain is generally perpendicular (i.e., vertical) to the substrate surface and, therefore, parallel to the height of the semiconductor fin.

SUMMARY

In an embodiment, a structure includes a gate stack, an interlayer dielectric layer over the gate stack, a first contact extending vertically through the interlayer dielectric layer to a first section of the gate stack, and a second contact extending vertically through the interlayer dielectric layer to a second section of the gate stack. The structure further includes a pillar laterally arranged in the interlayer dielectric layer between the first contact and the second contact. The pillar, which is composed of a dielectric material, penetrates vertically through the gate stack and divides the gate stack into the first section and the second section.

In an embodiment, a method includes depositing a gate stack, depositing an interlayer dielectric layer over the gate stack, forming a first opening in the interlayer dielectric layer that penetrates through the gate stack to cut the gate stack into a first section and a second section, and depositing a dielectric material in the first opening to form a pillar arranged between the first section of the gate stack and the second section of the gate stack. After filling the opening with the first dielectric material, a second opening and a third opening are formed in the interlayer dielectric layer that penetrate to the gate stack and that are divided by the pillar. A first contact in the second opening is coupled with the first section of the gate stack, and a second contact in the third opening is coupled with the second section of the gate stack.

In an embodiment, a method includes depositing a gate stack, depositing an interlayer dielectric layer over the gate stack, forming a first opening in the interlayer dielectric layer that penetrates to the gate stack, and depositing a material in the first opening and over the gate stack. The method further includes, after depositing the material in the first opening, forming a second opening that penetrates through the material in the first opening and through the gate stack to cut the gate stack into a first section and a second section. The second opening is filled with a dielectric material to form a pillar arranged between the first section of the gate stack and the second section of the gate stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
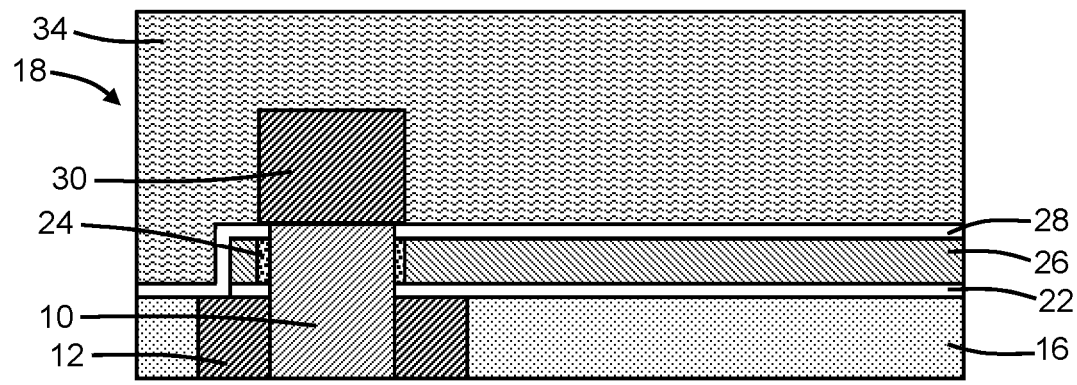
FIGS. 1-5 are cross-sectional views showing a structure at successive fabrication stages of a processing method in accordance with embodiments of the invention.

With reference to FIG. 1 and in accordance with embodiments of the invention, a fin 10 projects in a vertical direction from a bottom source/drain region 12 of a vertical-transport field-effect transistor 18. As used herein, the term "source/drain region" connotes a doped region of semiconductor material that can function as either a source or a drain of a vertical-transport field-effect transistor. The fin 10 may be formed from an epitaxial layer of semiconductor material, such as undoped or intrinsic silicon, that is grown over the bottom source/drain region 12 and patterned using, for example, self-aligned double patterning (SADP) or self-aligned quadruple patterning (SAQP). In connection with the formation of an n-type vertical-transport field-effect transistor 18, the bottom source/drain region 12 may be composed of semiconductor material formed by an epitaxial growth process with in-situ doping, and may include a concentration of an n-type dopant from Group V of the Periodic Table (e.g., phosphorus (P) and/or arsenic (As)) that provides n-type electrical conductivity. In connection with the formation of a p-type vertical-transport field-effect transistor 18, the bottom source/drain region 12 may be composed of semiconductor material formed by an epitaxial growth process with in-situ doping, and may include a concentration of p-type dopant from Group III of the Periodic Table (e.g., boron (B), aluminum (Al), gallium (Ga), and/or indium (In)) that provides p-type electrical conductivity.

Trench isolation regions 16 may be formed by a shallow trench isolation (STI) technique and may be comprised of a dielectric material, such as an oxide of silicon (e.g., silicon dioxide ($SiO_2$)). The trench isolation regions 16 electrically isolate the bottom source/drain region 12 from adjacent bottom source/drain regions of other nearby vertical-transport field-effect transistors (not shown).

A bottom spacer layer 22 is arranged on the bottom source/drain region 12 and trench isolation regions 16. The bottom spacer layer 22 may be composed of a dielectric material, such as silicon nitride ($Si_3N_4$), that is formed by high-density plasma (HDP) deposition or by gas cluster ion beam (GCM) deposition. The fin 10 extends in the vertical direction through the thickness of the bottom spacer layer 22.

A gate dielectric layer 24 is arranged on the sidewalls of the fin 10. The gate dielectric layer 24 may be composed of a dielectric material, such as a high-k dielectric having a dielectric constant (e.g., permittivity) higher than the dielectric constant of $SiO_2$. Candidate high-k dielectric materials for the gate dielectric layer 24 include, but are not limited to, a hafnium-based dielectric material like hafnium oxide ($HfO_2$), a layered stack of a hafnium-based dielectric material and another other dielectric material (e.g., aluminum oxide ($Al_2O_3$)), or combinations of these and other dielectric materials.

A gate stack 26 includes horizontal sections that are arranged on the bottom spacer layer 22 and a vertical section that surrounds or wraps about the fin 10. The different sections of the gate stack 26 define an unbroken and continuous layer. The gate dielectric layer 24 is arranged between the gate stack 26 and the exterior surfaces of the fin 10. The gate stack 26 may include one or more conformal barrier metal layers and/or work function metal layers, such as layers composed of titanium aluminum carbide (TiAlC) and/or titanium nitride (TiN), and a metal cap layer composed of a conductor, such as tungsten (W) or titanium nitride (TiN). The layers of the gate stack 26 may be serially deposited by, for example, atomic layer deposition (ALD), physical vapor deposition (PVD) or chemical vapor deposition (CVD), on the fin 10 and may be recessed following deposition.

A top spacer layer 28 is arranged on the gate stack 26. The top spacer layer 28 may be composed of a dielectric material, such as silicon nitride ($Si_3N_4$), that is deposited by a directional deposition technique, such as high-density plasma (HDP) deposition or gas cluster ion beam (GCIB) deposition. The fin 10 extends in the vertical direction through the thickness of the top spacer layer 28 and has an exposed top surface.

A top source/drain region 30 is arranged on the top surface of the fin 10 that is exposed through the top spacer layer 28. The top source/drain region 30 may be composed of semiconductor material that is doped to have the same conductivity type as the bottom source/drain region 12. If the bottom source/drain region 12 is n-type, then the top source/drain region 30 may be a section of semiconductor material formed by an epitaxial growth process with in-situ doping, and may include a concentration of an n-type dopant from Group V of the Periodic Table (e.g., phosphorus (P) and/or arsenic (As)) that provides n-type electrical conductivity. If the bottom source/drain region 12 is p-type, then the top source/drain region 30 may be a section of semiconductor material formed by an epitaxial growth process with in-situ doping, and may include a concentration of a p-type dopant from Group III of the Periodic Table (e.g., boron (B), aluminum (Al), gallium (Ga), and/or indium (In)) that provides p-type electrical conductivity. The fin 10 extends in the vertical direction from the bottom source/drain region 12 to the top source/drain region 30, and the gate stack 26 is arranged in the vertical direction between the bottom source/drain region 12 and the top source/drain region 30 with the spacer layers 22, 28 providing electrical isolation.

A lithography and etching process is performed to define sections of the gate stack 26 that provide gate extensions for gate contacts and sections of the gate stack 26 that may provide gate extensions for cross-couplings between the gates of each complementary transistor pairs. An interlayer dielectric layer 34 is formed over the partially-completed vertical-transport field-effect transistor 18. The interlayer dielectric layer 34 may be composed of a dielectric material, such as an oxide of silicon (e.g., silicon dioxide ($SiO_2$)) deposited by chemical vapor deposition (CVD).

Figure 2:
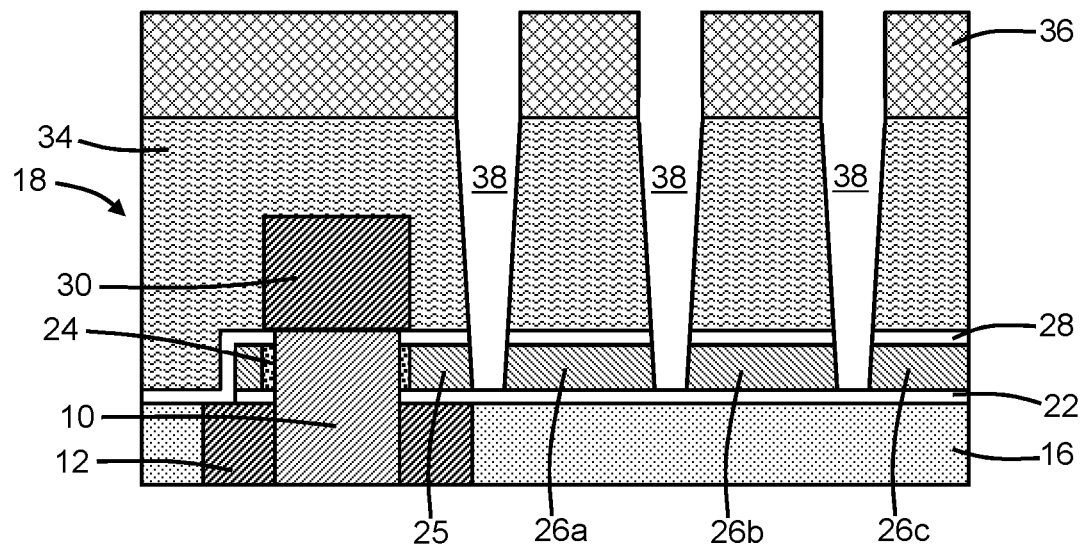

With reference to FIG. 2 in which like reference numerals refer to like features in FIG. 1 and at a subsequent fabrication stage, a lithography and etching process is used to concurrently form cuts in the gate stack 26 and to form contact openings extending to the gate stack 26 after the interlayer dielectric layer 34 is formed. To that end, an etch mask 36 is formed over the interlayer dielectric layer 34. The etch mask 36 may include a layer of a photoresist that is applied by a spin coating process, pre-baked, exposed to light projected through a photomask, baked after exposure, and developed with a chemical developer. The etch mask 36 may also include an anti-reflective coating, a hardmask (e.g., SiN), and/or a spin-on hardmask, such as an organic planarization layer (OPL), that are patterned along with the photoresist.

Openings 38 are formed in the interlayer dielectric layer 34 by an etching process, which may be a reactive ion etching (RIE) process or a wet chemical process, using a given etch chemistry. The openings in the etch mask 36 determine the size, arrangement, and locations of the openings 38 that are etched in the interlayer dielectric layer 34. The openings 38 extend through the gate stack 26 over the trench isolation regions 16 such that the gate stack 26 is cut or divided into a gate electrode 25 and distinct sections 26a, 26b, 26c. The gate electrode 25 is associated with the vertical-transport field-effect transistor 18, and is connected with a gate contact region (not shown) of the gate stack 26. The different sections 26a, 26b, 26c of the gate stack 26 provide gate contact regions that are connected with the gate electrodes of other vertical-transport field-effect transistors (not shown) arranged near the vertical-transport field-effect transistor 18.

Figure 3:
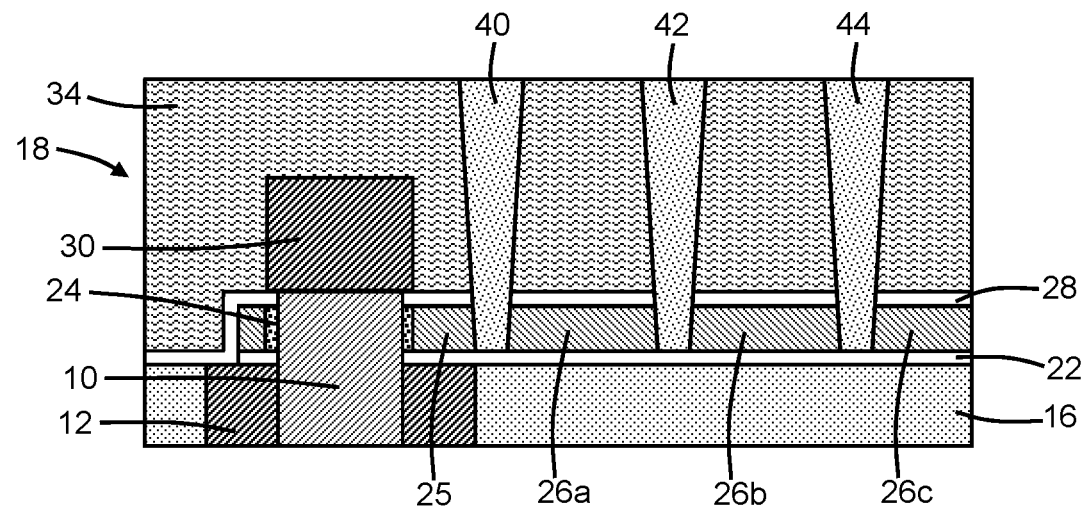

With reference to FIG. 3 in which like reference numerals refer to like features in FIG. 2 and at a subsequent fabrication stage, pillars 40, 42, 44 are formed in the openings 38 by depositing a dielectric material and polishing the dielectric with chemical mechanical polishing to be coplanar with the top surface of the interlayer dielectric layer 34. The dielectric material used to form the pillars 40, 42, 44 is selected to have etch selectivity relative to the interlayer dielectric layer 34. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 4:
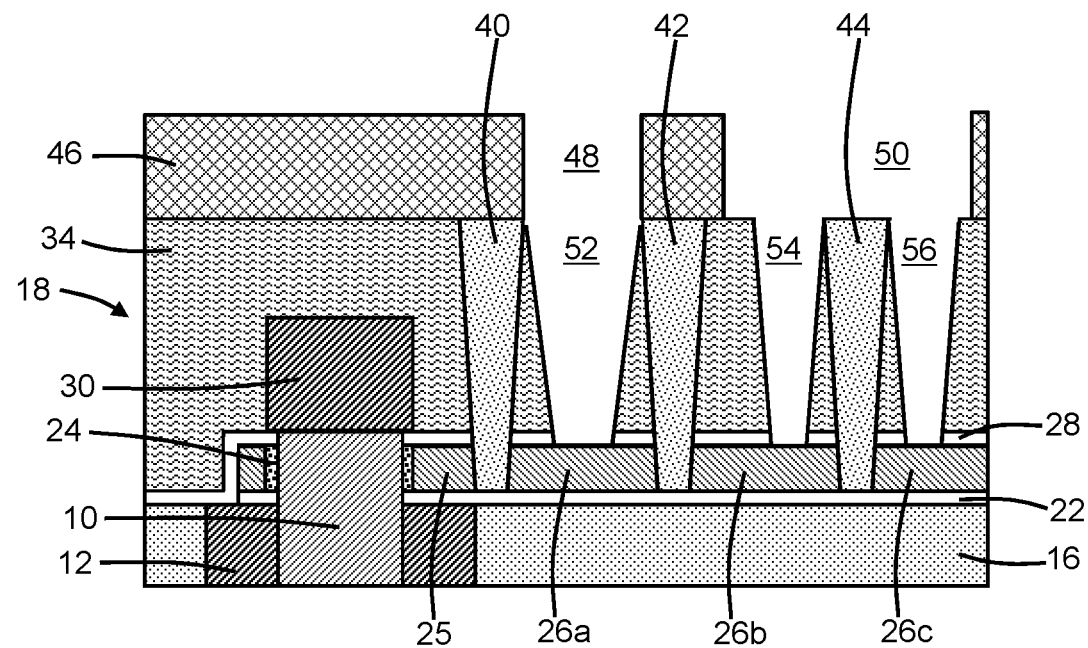

With reference to FIG. 4 in which like reference numerals refer to like features in FIG. 3 and at a subsequent fabrication stage, an etch mask 46 is formed over the interlayer dielectric layer 34. The etch mask 46 may be composed of a layer of a light-sensitive material, such as an organic photoresist, applied by a spin coating process, pre-baked, exposed to light projected through a photomask, baked after exposure, and developed with a chemical developer. The etch mask 46 may also include an anti-reflective coating, a hardmask (e.g., SiN), and/or a spin-on hardmask, such as an organic planarization layer (OPL), that are patterned along with the patterned photoresist.

The etch mask 46 includes an opening 48 that is aligned with the gate stack section 26a generally in the space between the pillar 40 and the pillar 42, and that represents a conventional contact opening. The etch mask 46 includes another opening 50 that is aligned with the pillar 44 and the interlayer dielectric layer 34 over the gate stack sections 26b, 26c, which are located on opposite sides of the pillar 44. Multiple contact openings 52, 54, 56 are formed in the interlayer dielectric layer 34 at the respective locations of the openings 48, 50 in the etch mask 46 by an etching process, which may be a reactive ion etching (RIE) process or a wet chemical process. The etching process relies on a given etch chemistry that removes the dielectric material of the interlayer dielectric layer 34 selective to the dielectric material of the pillars 40, 42, 44.

The pillar 44 operates to self-align the formation of the contact opening 54 and the contact opening 56 relative to their associated gate stack sections 26b, 26c. The self-alignment promotes the ability to form multiple contact openings 54 and 56 in the interlayer dielectric layer 34 using only a single opening 50 in the etch mask 46 that overlaps with the pillar 44. The locations and dimensions of the contact openings 54, 56 are established at least in part by the pillar 44. The contact openings 54 and 56, which are formed concurrently in a merged manner, may be smaller in size than individual openings formed by a conventional non-self-aligned photolithography and etching process.

The contact openings 52, 54, 56 extend to the respective gate stack sections 26a, 26b, 26c and, in the representative embodiment, may terminate at a top surface of the gate stack sections 26a, 26b, 26c. However, in an alternative embodiment, the contact openings 52, 54, 56 may penetrate into and at least partially through the gate stack sections 26a, 26b, 26c. The opening 50 in the etch mask 46 may be a bar opening that is rectangular in shape and arranged to overlap with the pillar 44, which results in the pillar 44 being arranged between the contact opening 54 and the opening 56. In an embodiment, the overlap may be symmetrical relative to the pillar 44 such that the contact opening 54 and contact opening 56 in the interlayer dielectric layer 34 are also symmetrical relative to the pillar 44. Alternatively, the opening 50 in the etch mask 46 may be arranged such that the contact opening 54 and the contact opening 56 in the interlayer dielectric layer 34 are not symmetrical relative to the pillar 44 (i.e., are asymmetrical) and, as a result, one of the contact openings 54, 56 may be larger in lateral dimensions than the other of the contact openings 54, 56. Due to the etch selectivity, the pillar 44 is arranged between the contact opening 54 and the contact opening 56, and provides a partition that divides the different contact openings 54, 56.

Instead of rectangular, the opening 50 may have the shape of a square or other geometrical shape arranged to overlap with the pillar 44. In an alternative embodiment, the opening 50 may be enlarged to extend laterally to reveal multiple pillars.

Figure 5:
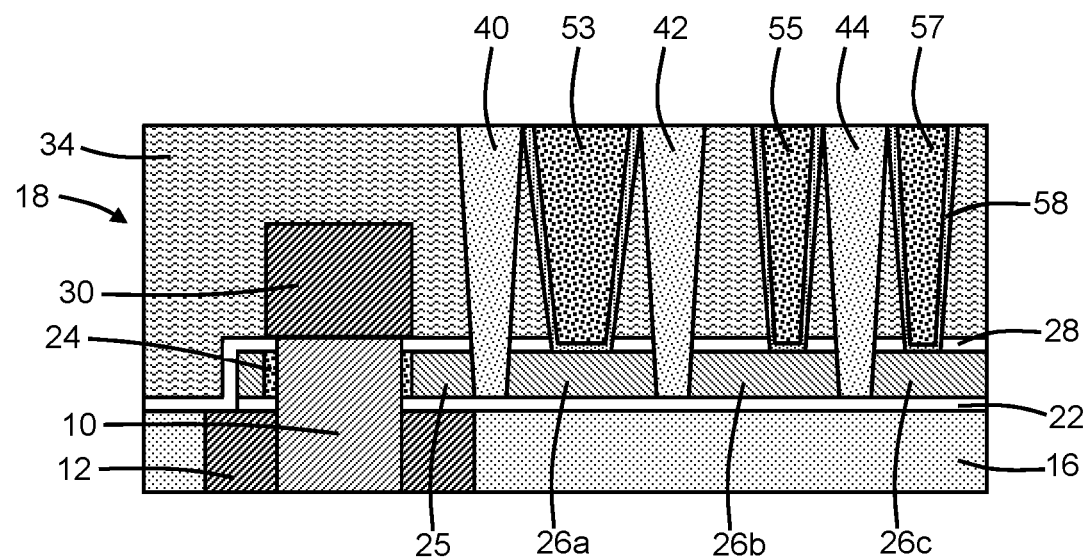

With reference to FIG. 5 in which like reference numerals refer to like features in FIG. 4 and at a subsequent fabrication stage, the contact openings 52, 54, 56 (FIG. 4) in the interlayer dielectric layer 34 are filled with one or more conductors to respectively form contacts 53, 55, and 57. The contact openings 52, 54, 56 may be lined with a liner layer 58, followed by filling with a metal, such as a metal silicide and/or tungsten (W), and chemical mechanical polishing to form the contacts 53, 55, 57. Each of the contacts 53, 55, 57 extends vertically through the interlayer dielectric layer 34 to indirectly contact one of the gate stack sections 26a, 26b, 26c. Specifically, the contact 55 physically contacts the gate stack section 26b on one side of the pillar 44 and the contact 57 physically contacts the gate stack section 26c on an opposite side of the pillar 44. The gate stack sections 26a, 26b, 26c extend laterally to respective vertical-transport field-effect transistors (not shown) that are similar to the vertical-transport field-effect transistor 18.

Figure 6:
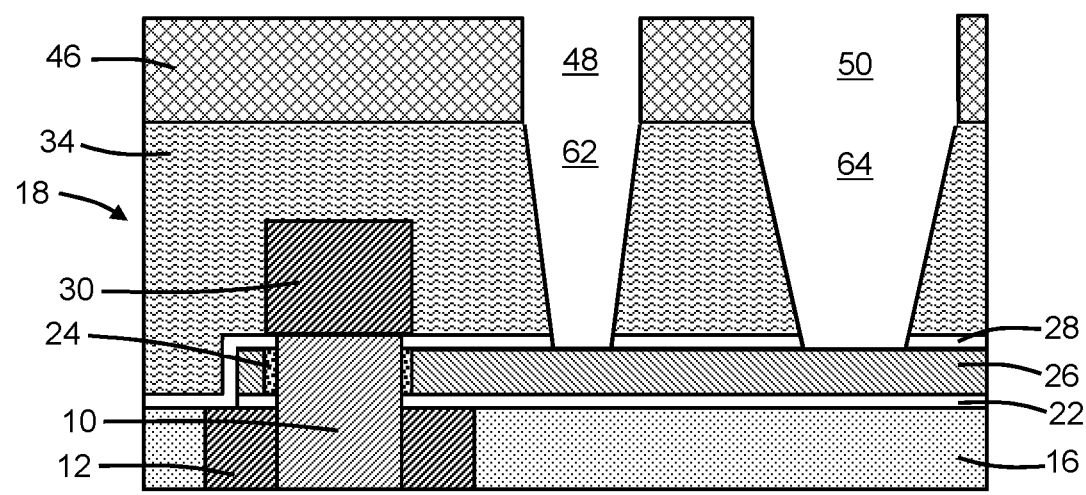
FIGS. 6-8 are cross-sectional views showing a structure at successive fabrication stages of a processing method in accordance with embodiments of the invention.

With reference to FIG. 6 in which like reference numerals refer to like features in FIG. 5 and in accordance with alternative embodiments of the invention, the order of the process flow may be altered to form the contacts prior to forming the pillars. To that end, the etch mask 46 is formed over the interlayer dielectric layer 34. The opening 48 in the etch mask 46 is arranged at the prospective location of the contact 53 and the opening 50 in the etch mask 46 is arranged at the prospective locations of the contacts 55 and 57. Contact openings 62 and 64 are formed in the interlayer dielectric layer 34 at the respective locations of openings 48, 50 in the etch mask 46 by an etching process, such as reactive ion etching (RIE). The contact openings 62, 64 in the interlayer dielectric layer 34 extend to the gate stack 26 and, in the representative embodiment, may terminate at a top surface of the gate stack 26. However, in an alternative embodiment, the contact openings 62, 64 may penetrate into and at least partially through the gate stack 26.

Other openings (not shown) may be formed in the interlayer dielectric layer 34 that extend to the bottom source/drain region 12 and to the top source/drain region 30. The openings 48, 50 may be formed after forming the openings to the source/drain regions 12, 30, or the ordering may be changed. For example, the openings to the source/drain regions 12 may be formed, these openings may be filled by an organic planarization layer and the openings to the source/drain regions 30 may be formed, and then the openings to the source/drain region 12 and the openings to the source/drain region 30 may be filled by an organic planarization layer and the contact openings 62, 64 may be formed.

Figure 7:
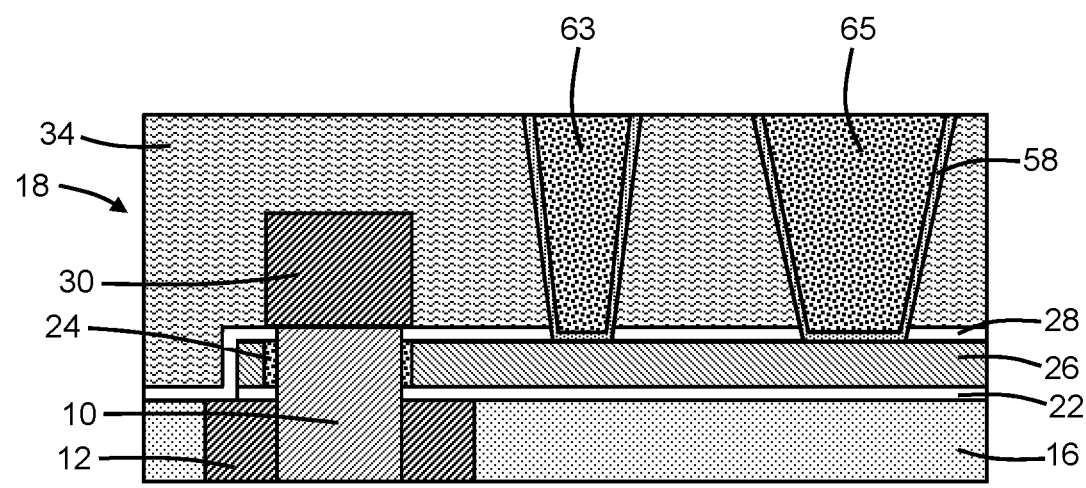

With reference to FIG. 7 in which like reference numerals refer to like features in FIG. 6 and at a subsequent fabrication stage, a contact 63 similar to contact 53 and a contact 65 are respectively formed in the contact openings 62, 64. The contact openings 62, 64 may be lined with the liner layer 58, followed by filling with a metal, such as a metal silicide and/or tungsten (W), and chemical mechanical polishing to form the contacts 63, 65. Each of the contacts 63 and 65 extends vertically through the interlayer dielectric layer 34 to indirectly contact the gate stack 26.

Figure 8:
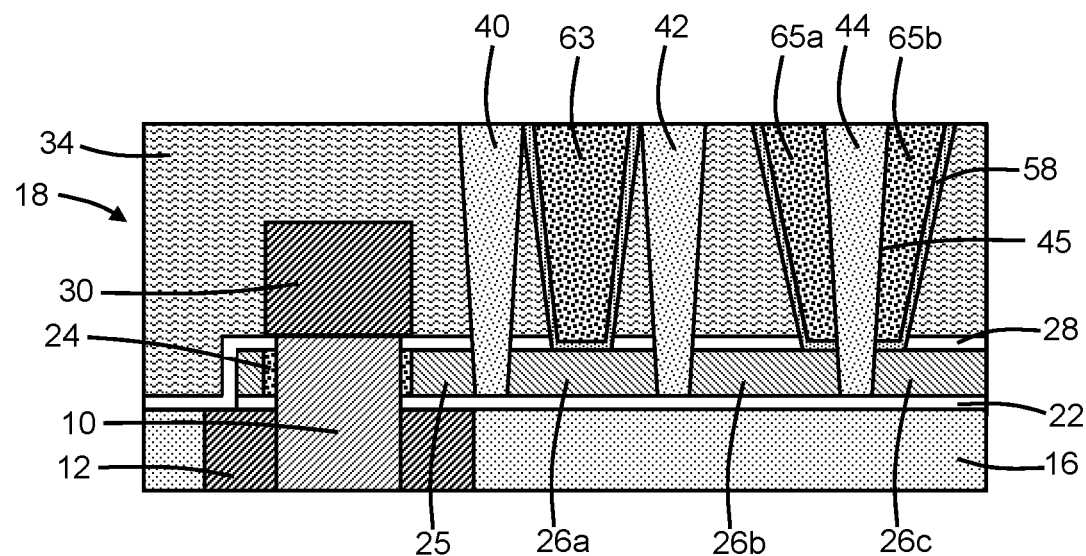

With reference to FIG. 8 in which like reference numerals refer to like features in FIG. 7 and at a subsequent fabrication stage, the cuts and pillars are formed in the gate stack 26 after the contacts 63 and 65 are formed. To that end, the process flow continues as described in the context of FIGS. 2 and 3. The etch mask 36 is formed over the interlayer dielectric layer 34, and an etching process is used to transfer the openings from the etch mask 36 to form the openings 38 in the interlayer dielectric layer 34 and also an opening 38 in the contact 65 (FIG. 7). The openings 38 are filled with dielectric material to form the pillars 40, 42, 44. The pillar 44 divides the contact 65 to form contact 65a on one side of pillar 44 and contact 65b on the opposite side of pillar 44. The division of the contact 65 into multiple contacts 65a, 65b through the use of a cut and pillar 44 self-aligns the contacts 65a, 65b with the gate stack sections 26b, 26c, and permits a single opening 50 in the etch mask 46 when patterning the interlayer dielectric layer 34.

The final structure is similar to the structure of FIG. 5, except that the contacts 65a, 65b extend through the liner layer 58 and the contacts 65a, 65b are in direct contact with the opposite vertical sidewalls 45 of the pillar 44 as the liner layer 58 is deposited before the pillar 44 is formed. Due to the formation of the pillar 44 after the contact 65, each of the contacts 65a, 65b has a reentrant profile that is widest at the top surface of the interlayer dielectric layer 34 and narrowest adjacent to the gate stack 26.

Figure 9:
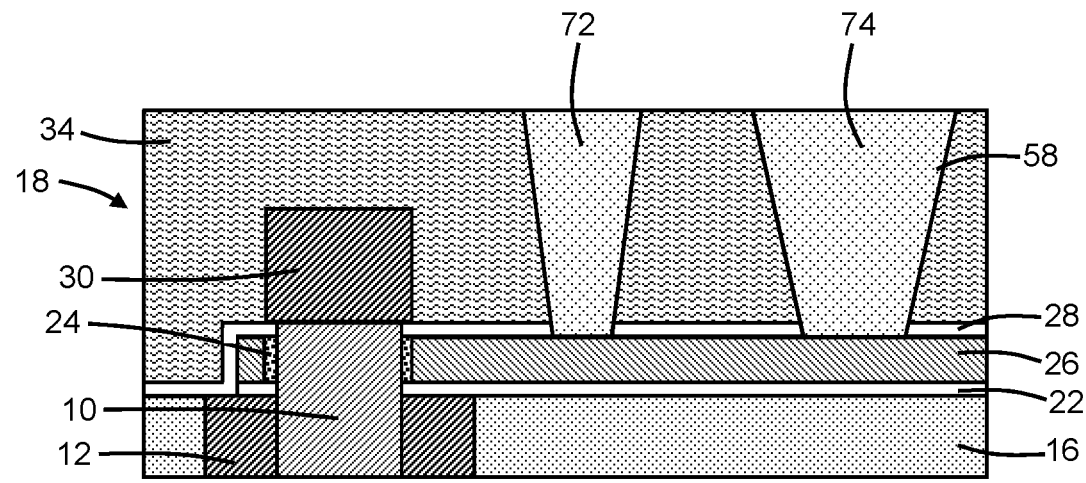
FIGS. 9-12 are cross-sectional views showing a structure at successive fabrication stages of a processing method in accordance with embodiments of the invention.

With reference to FIG. 9 in which like reference numerals refer to like features in FIG. 6 and in accordance with alternative embodiments of the invention, the contact openings 62 and 64 may be formed and filled with sections 72, 74 of a sacrificial material that is selected to be removed selective to the materials of the interlayer dielectric layer 34 and the pillars 40, 42, 44. In an embodiment, the sacrificial material may be amorphous silicon or a dielectric material that can be removed with a high etch selectivity to the dielectric materials of the interlayer dielectric layer 34 and the pillars 40, 42, 44.

Figure 10:
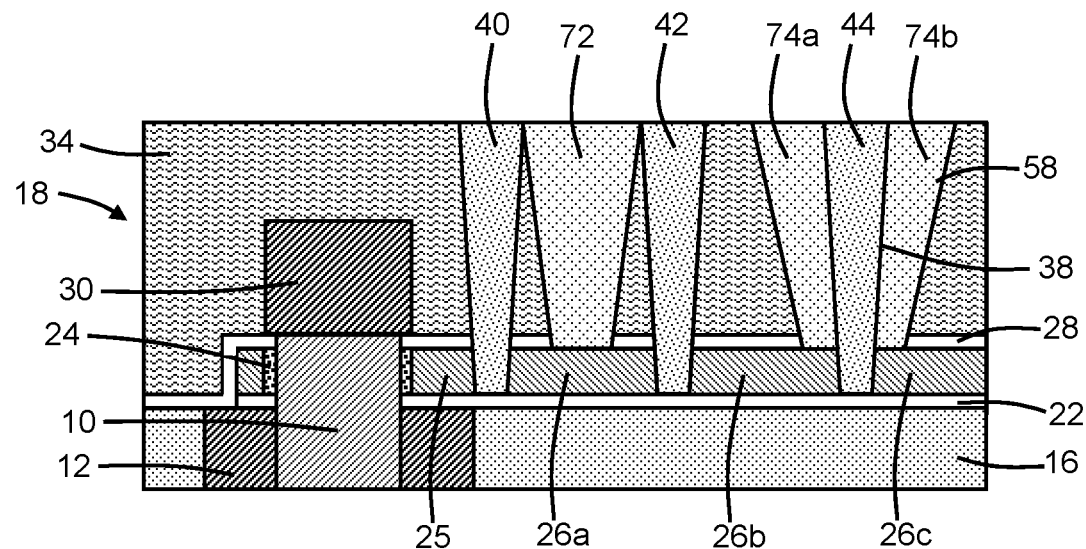

With reference to FIG. 10 in which like reference numerals refer to like features in FIG. 9 and at a subsequent fabrication stage, the cuts and pillars are formed in the gate stack 26 after the contact openings 62 and 64 are formed and filled with the sections 72, 74 of sacrificial material. To that end, the process flow continues as described in the context of FIGS. 2 and 3. The etch mask 36 is formed over the interlayer dielectric layer 34, and an etching process is used to transfer the openings in the etch mask 36 to form the openings 38 in the interlayer dielectric layer 34 and an opening 38 in the section 74 of the sacrificial material in the contact opening 64. The openings 38 extend as cuts through the gate stack 26, and are filled with dielectric material to form the pillars 40, 42, 44. The pillars 40 and 42 extend through the interlayer dielectric layer 34 over the gate stack 26. The pillar 44 extends through the section 74 of the sacrificial material in the contact opening 64 and divides the section 74 into sections 74a, 74b.

Figure 11:
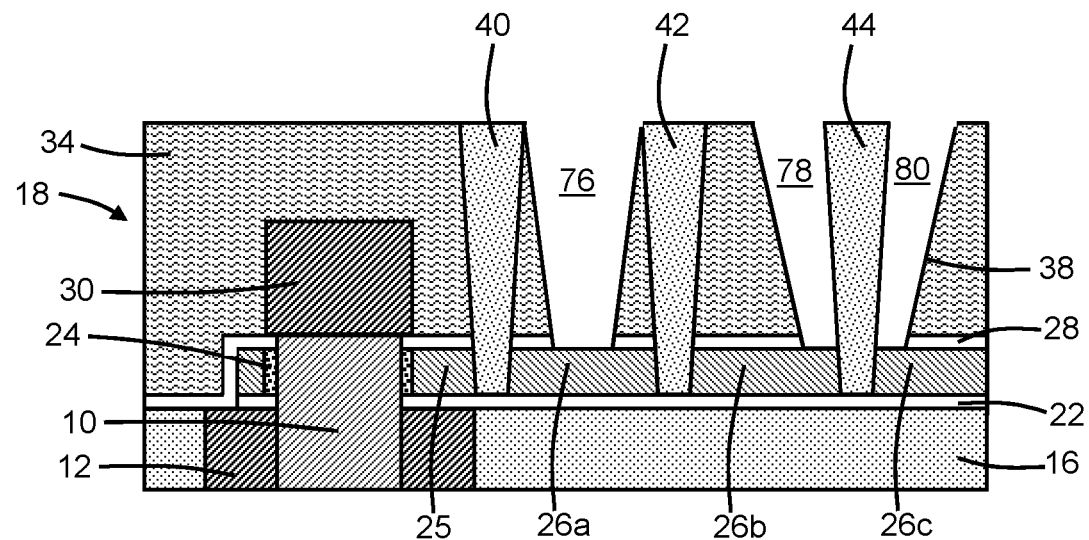

With reference to FIG. 11 in which like reference numerals refer to like features in FIG. 10 and at a subsequent fabrication stage, the sections 72, 74a, 74b of sacrificial material are removed by an etching process, which may be a reactive ion etching (RIE) process or a wet chemical process, using a given etch chemistry that removes the sacrificial material selective to the materials of the interlayer dielectric layer 34 and the pillars 40, 42, 44. The resultant contact openings 76, 78, 80 extend to the gate stack sections 26a, 26b, 26c and, in the representative embodiment, may terminate at a top surface of the gate stack sections 26a, 26b, 26c. However, in an alternative embodiment, the contact openings 52, 54, 56 may penetrate into and at least partially through the gate stack sections 26a, 26b, 26c. The etching process may be performed without a mask (i.e., maskless) due to the etch selectivity between the materials of the sacrificial material and the pillars 40, 42, 44. The pillar 44 provides self-alignment of the contact openings 78, 80 with the gate stack sections 26b, 26c when the sacrificial material is removed, and permits a single opening 50 in the etch mask 46 when patterning the interlayer dielectric layer 34.

Figure 12:
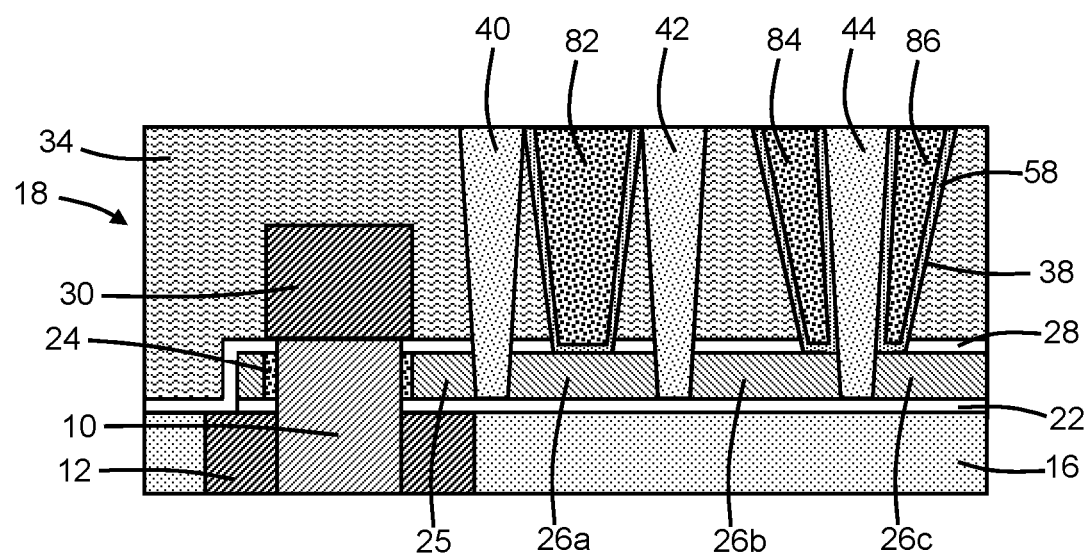

With reference to FIG. 12 in which like reference numerals refer to like features in FIG. 11 and at a subsequent fabrication stage, the contact openings 76, 78, 80 may be lined with the liner layer 58, followed by filling with a metal, such as a metal silicide and/or tungsten (W), and chemical mechanical polishing to form contacts 82, 84, 86. Each of the contacts 82, 84, 86 extends vertically through the interlayer dielectric layer 34 to one of the gate stack sections 26a, 26b, 26c. The pillar 44 is arranged to physically separate the contact 84 from the contact 86. Because the contacts 84 and 86 are formed after the formation of the pillar 44, the liner layer 58 is arranged between the pillar 44 and the contact 84, and between the pillar 44 and contact 86.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a vertical-transport field-effect transistor including a first source/drain region, a second source/drain region, and a semiconductor fin arranged to project vertically from the first source/drain region to the second source/drain region, the first source/drain region and the second source/drain region each comprised of a semiconductor material;
   a plurality of trench isolation regions;
   a first dielectric spacer layer positioned on the first source/drain region and the plurality of trench isolation regions;
   a gate stack including a first section on the first dielectric spacer layer, a second section on the first dielectric spacer layer, and a third section on the first dielectric spacer layer, the third section of the gate stack vertically arranged between the first source/drain region and the second source/drain region, and the third section of the gate stack wrapped about the semiconductor fin to define a gate electrode of the vertical-transport field-effect transistor;

a second dielectric spacer layer positioned on the first section, the second section, and the third section of the gate stack, the semiconductor fin extending vertically through a thickness of the second dielectric spacer layer to the second source/drain region;

an interlayer dielectric layer over the second dielectric spacer layer, the interlayer dielectric layer including a first contact opening extending through the second dielectric spacer layer to the first section of the gate stack and a second contact opening extending through the second dielectric spacer layer to the second section of the gate stack;

a first gate contact in the first contact opening, the first gate contact in physical contact with the first section of the gate stack;

a second gate contact in the second contact opening, the second gate contact in physical contact with the second section of the gate stack; and a dielectric pillar laterally arranged between the first contact opening and the second contact opening in the interlayer dielectric layer and between the first section and the second section of the gate stack.

2. The structure of claim 1 wherein the dielectric pillar is composed of a first dielectric material, the interlayer dielectric layer is composed of a second dielectric material having a different composition than the first dielectric material, and the second dielectric material of the interlayer dielectric layer has a different etch selectivity than the first dielectric material of the dielectric pillar.

3. The structure of claim 1 wherein the first gate contact includes a metal fill and a liner layer having a first section and a second section, the first section of the liner layer arranged between the metal fill and the first section of the gate stack, and the second section of the liner layer arranged between the dielectric pillar and the metal fill.

4. The structure of claim 1 wherein the first gate contact includes a first metal fill and a liner layer having a first section arranged between the first metal fill and the first section of the gate stack, and the dielectric pillar has a directly contacting relationship with the first gate contact.

5. The structure of claim 4 wherein the second gate contact includes a second metal fill and a second section of the liner layer, the second section of the liner layer arranged between the second metal fill and the second section of the gate stack, and the dielectric pillar has a directly contacting relationship with the second gate contact.

6. The structure of claim 1 wherein the first gate contact and the second gate contact each have a reentrant profile.

7. The structure of claim 1 wherein the first contact opening and the second contact opening are symmetrically arranged relative to the dielectric pillar.

8. The structure of claim 1 wherein the first contact opening and the second contact opening are asymmetrically arranged relative to the dielectric pillar.

9. The structure of claim 8 wherein the first contact opening is larger in lateral dimensions than the second contact opening.

10. The structure of claim 1 wherein the first gate contact terminates at a top surface of the first section of the gate stack, and the second gate contact terminates at a top surface of the second section of the gate stack.

* * * * *